US011508699B2

(12) United States Patent
Liu et al.

(10) Patent No.: US 11,508,699 B2
(45) Date of Patent: Nov. 22, 2022

(54) DISPLAY PANEL AND PIXEL STRUCTURE THEREOF

(71) Applicant: AU Optronics Corporation, Hsin-Chu (TW)

(72) Inventors: Pin-Miao Liu, Hsin-Chu (TW); Chen-Chang Chen, Hsin-Chu (TW); Wen-Wei Yang, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 143 days.

(21) Appl. No.: 16/657,411

(22) Filed: Oct. 18, 2019

(65) Prior Publication Data

US 2020/0144229 A1    May 7, 2020

(30) Foreign Application Priority Data

Nov. 2, 2018 (TW) ................... 107139049

(51) Int. Cl.
*H01L 27/32* (2006.01)
*H01L 51/52* (2006.01)
(Continued)

(52) U.S. Cl.
CPC .......... *H01L 25/0753* (2013.01); *H01L 33/24* (2013.01); *H01L 33/38* (2013.01); *H01L 33/60* (2013.01)

(58) Field of Classification Search
None
See application file for complete search history.

(56) References Cited

U.S. PATENT DOCUMENTS

| 7,654,687 B2* | 2/2010 | Tsai | G02B 6/0021 |
| | | | 362/97.3 |
| 9,897,266 B2* | 2/2018 | Moon | F21V 3/049 |

(Continued)

FOREIGN PATENT DOCUMENTS

| CN | 101275720 A | 10/2008 |
| CN | 104979375 A | 10/2015 |

(Continued)

OTHER PUBLICATIONS

Office Action issued by CNIPA dated Apr. 29, 2020 for the corresponding China application.

(Continued)

*Primary Examiner* — Nishath Yasmeen
(74) *Attorney, Agent, or Firm* — WPAT, PC

(57) ABSTRACT

A display panel and a pixel structure are provided. The pixel structure includes a substrate, a micro light emitting diode (micro LED or µLED), a sidewall structure, a filling layer, and a reflective layer. The substrate has a bearing surface, and the micro LED is disposed on the bearing surface directly or indirectly. The sidewall structure is disposed on the bearing surface and defines at least one accommodation cavity to accommodate the micro LED. The filling layer is filled in the accommodation cavity and surrounds the micro LED. The reflective layer covers a top surface of the filling layer and has a plurality of light-transmissible windows. The micro LED forms, in a vertical projection direction, a vertical projection region in an overlapping region on the reflective layer. Among the light-transmissible windows, those having longer distances to the vertical projection region have larger areas.

20 Claims, 12 Drawing Sheets

(51) Int. Cl.
  *H01L 51/56* (2006.01)
  *H01L 25/075* (2006.01)
  *H01L 33/24* (2010.01)
  *H01L 33/38* (2010.01)
  *H01L 33/60* (2010.01)

(56) References Cited

U.S. PATENT DOCUMENTS

| | | | | |
|---|---|---|---|---|
| 10,690,923 | B1* | 6/2020 | Luanava | G02B 26/08 |
| 10,871,607 | B2* | 12/2020 | Yasunaga | G02B 6/0055 |
| 2006/0164840 | A1* | 7/2006 | Song | G02F 1/133605 |
| | | | | 362/341 |
| 2007/0019394 | A1* | 1/2007 | Park | G02B 6/0021 |
| | | | | 362/23.18 |
| 2008/0239750 | A1* | 10/2008 | Chang | F21V 13/10 |
| | | | | 362/296.07 |
| 2009/0091920 | A1* | 4/2009 | Naijo | G02F 1/133603 |
| | | | | 362/97.3 |
| 2010/0232165 | A1* | 9/2010 | Sato | B60K 35/00 |
| | | | | 362/296.01 |
| 2010/0265694 | A1* | 10/2010 | Kim | G02B 6/0021 |
| | | | | 362/97.1 |
| 2012/0218752 | A1* | 8/2012 | Sumitani | G02F 1/133605 |
| | | | | 362/296.01 |
| 2014/0204578 | A1* | 7/2014 | Kim | F21V 7/00 |
| | | | | 362/235 |
| 2015/0293405 | A1* | 10/2015 | Park | G02F 1/133608 |
| | | | | 349/69 |
| 2017/0194602 | A1 | 7/2017 | Cui et al. | |
| 2018/0033928 | A1* | 2/2018 | Chang | H01L 33/56 |
| 2018/0294254 | A1 | 10/2018 | Chen et al. | |

FOREIGN PATENT DOCUMENTS

| | | |
|---|---|---|
| CN | 106684108 | 5/2017 |
| CN | 106782128 | 5/2017 |
| CN | 107342302 | 11/2017 |
| CN | 107544177 | 1/2018 |
| CN | 107564422 | 1/2018 |

OTHER PUBLICATIONS

CNIPA has issued the Office Action for the corresponding China application dated Sep. 28, 2020.

* cited by examiner

DISPLAY PANEL AND PIXEL STRUCTURE THEREOF

BACKGROUND

Technical Field

The present invention relates to a display panel and a pixel structure thereof, and specifically to a display panel having a micro light emitting diode (micro LED or μLED) and a pixel structure thereof.

Related Art

Planar and curved display devices have been widely applied in various electronic devices, for example, mobile phones, personal wearable devices, televisions, host computer for transportation means, personal computers, digital cameras, and handheld game consoles. However, with increasingly higher specification requirements such as a resolution requirement, a borderless requirement, and a thinning requirement, various types of display devices are developed continuously.

For example, micro LED display gradually become well known in recent years. In the so-called micro LED display, micron-scale LED chips are directly disposed on a substrate to serve as display pixels. Compared with a liquid crystal display device, the micro LED display can improve the photoelectric conversion efficiency, improve the luminance, and can avoid the thickness of a backlight module.

In the present technology, a micro LED display is manufactured by taking off batch-fabricated micro LEDs from an original substrate and then transferring the micro LEDs to a circuit substrate. However, because the quantity of micro LEDs transferred each time is limited, each batch of transferred micro LEDs may have a different light emitting characteristic. Such a situation may cause optical properties, such as the luminance, to be different in different blocks of the display, thus resulting in a poor image quality.

SUMMARY

An object of the present invention is to provide a pixel structure that can improve the uniformity of overall optical properties of a displayed image.

An object of the present invention is to provide a pixel structure that can reduce a difference in luminance or other optical properties between different pixels.

An object of the present invention is to provide a display panel, in which an aperture ratio of a reflective layer on a pixel structure can be adjusted to achieve required image display quality.

The pixel structure includes a substrate, a micro LED, a sidewall structure, a filling layer, and a reflective layer. The substrate has a bearing surface, and the micro LED is disposed on the bearing surface directly or indirectly. The sidewall structure is disposed on the bearing surface directly or indirectly and defines at least one accommodation cavity. The micro LED is completely or at least partially located within the accommodation cavity and is surrounded by the sidewall structure. The filling layer is filled in the accommodation cavity and surrounds the micro LED. The filling layer is light-transmissible, and light generated by the micro LED can pass through the filling layer. The filling layer has a top surface, and the reflective layer covers the top surface of the filling layer directly or indirectly. The reflective layer is refractive, and can reflect at least a part of light reaching the reflective layer. The reflective layer has a plurality of light-transmissible windows. The light-transmissible windows have higher light transmittance than other parts of the reflective layer. The micro LED forms, in a vertical projection direction, a vertical projection region in an overlapping region on the reflective layer, and among the light-transmissible windows, those having longer distances to the vertical projection region have larger areas.

Through such a configuration, the light generated by the micro LED reaches the reflective layer through the filling layer, where a part of the light passes through the light-transmissible windows and a part of the light is reflected by the reflective layer back to the accommodation cavity, is transferred to other positions of the reflective layer, and then goes out. Because the light-transmissible window above the micro LED and at a position overlapping with the reflective layer has a lower aperture ratio, peak light intensity of a single pixel structure above the micro LED can be reduced, and the width of a peak region with higher light intensity can be increased, so as to achieve a uniform effect.

The display panel includes a plurality of pixel structures. The pixel structures include a red pixel structure, a green pixel structure, and a blue pixel structure. The light-transmissible windows of the red pixel structure, the green pixel structure, and the blue pixel structure respectively have different total areas. With such a configuration, color tones presented by the display panel can be adjusted, thereby obtaining better image display quality.

DETAILED DESCRIPTION

The present invention provides a display panel and a pixel structure thereof, for example, a micro LED display panel.

For example, the present invention can be applied to a computer display, a television, a monitor, and an automobile display. In addition, the display device may also be applied in other electronic devices, for example, used as a display screen of a mobile phone, a digital camera, a handheld game console, or the like. However, applications are not limited thereto, and may be adjusted as required.

Figure 1:
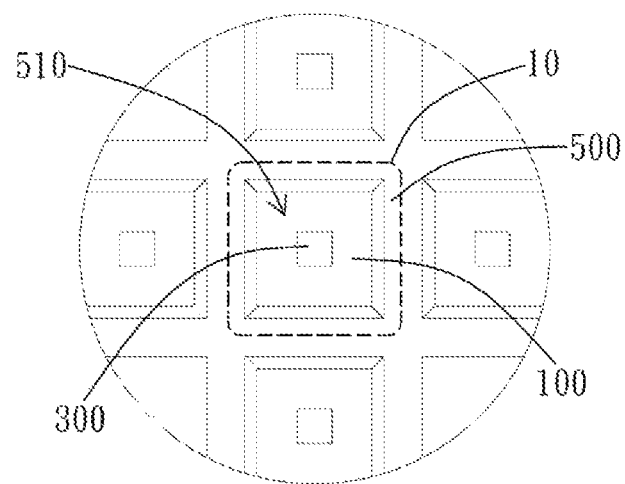
FIG. 1 is a schematic top view of an embodiment of a pixel structure.
Figure 2:
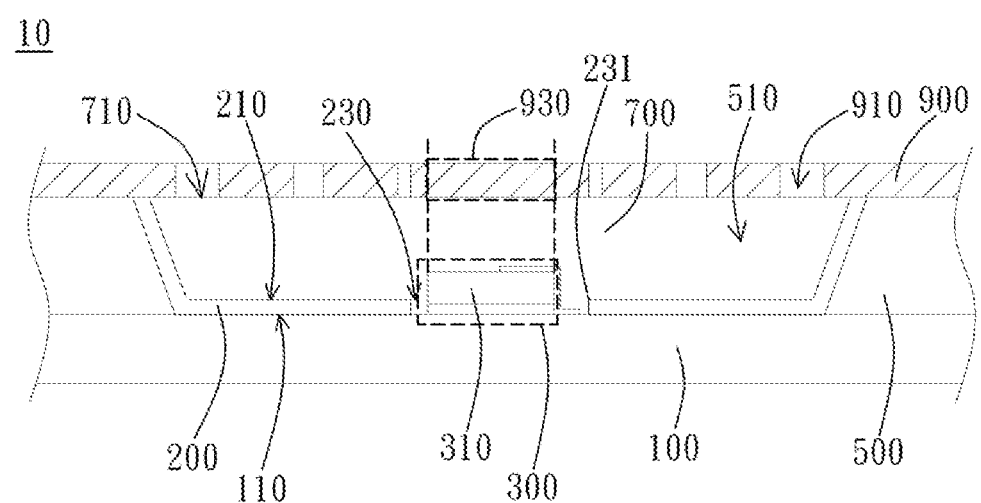
FIG. 2 is a schematic cross-sectional view of an embodiment of a pixel structure.

FIG. 1 and FIG. 2 are a schematic top view and a schematic cross-sectional view of an embodiment of a pixel structure. As shown in FIG. 1 and FIG. 2, the pixel structure 10 includes a substrate 100, a micro LED 300, a sidewall structure 500, a filling layer 700, and a reflective layer 900. For ease of description of a relative relationship between components, FIG. 1 shows the pixel structure 10 in which the reflective layer 900 is not disposed yet. Preferably, a circuit is disposed on the substrate 100, and the substrate may be made of plastic, silicon, or other transparent or non-transparent materials. The substrate 100 also has a bearing surface 110, and the micro LED 300 is directly or indirectly disposed on the bearing surface 110. The micro LED 300 is preferably a micron-scale LED, for example, the size is from one micron to dozens of microns. For example, the size is equal to or less than 30 μm, but is not limited thereto. In addition, in this embodiment, two electrodes of the micro LED 300 are both connected to the circuit on the substrate 100, but the present invention is not limited thereto.

As shown in FIG. 1 and FIG. 2, the sidewall structure 500 is disposed on the bearing surface 110 directly or indirectly and defines at least one accommodation cavity 510. Preferably, the sidewall structure 500 completely or at least partially surrounds side edges of the accommodation cavity 510, and leaves over an opening for transmitting light. The opening and the bearing surface 110 are located on opposite sides of the accommodation cavity 510. The micro LED 300 is completely or at least partially located in the accommodation cavity 510 and is surrounded by the sidewall structure 500. It should be noted that, the circuit on the substrate 100 can be disposed before or after disposition of the sidewall structure 500 and/or the micro LED 300. In other words, it is also possible that the circuit is disposed on the substrate 100 after the sidewall structure 500 and/or the micro LED 300 is disposed on the substrate 100. The circuit can refer to a line for electrically connecting the micro LED 300 and a drive signal (not shown) in general.

As shown in FIG. 2, the pixel structure 10 may selectively include a bottom reflective layer 200. The bottom reflective layer 200 is disposed on the bearing surface 110 and/or an inner surface of the sidewall structure 500 and surrounds the micro LED 300. The bottom reflective layer 200 has a reflective top surface 210. The reflective top surface 210 is closer to the bearing surface 110 than an active light emitting layer 310 of the micro LED 300, but the present invention is not limited thereto. In addition, a through hole 230 for accommodating the micro LED 300 is formed in the bottom reflective layer 200. The through hole 230 has an inner edge 231. Preferably, there is a spacing between the inner edge 231 of the through hole and the micro LED 300. However, in a different embodiment, the bottom reflective layer 200 is not necessarily disposed. For example, the sidewall structure 500 may be formed by using a white material, so that the sidewall structure 500 has a certain light reflection effect itself.

As shown in FIG. 2, the filling layer 700 is filled in the accommodation cavity 510 and surrounds the micro LED 300. The filling layer 700 is light transmissible, and light generated by the micro LED 300 can pass through the filling layer 700. In addition, the filling layer 700 may selectively have a light modulation property. For example, the filling layer 700 modulates the direction, wavelength, spectral distribution, and the like, so that the outgoing light can have desired optical characteristics. For example, different materials such as quantum dots, color resistors, and fluorescent powder may be added to the filling layer, to change characteristics of the light.

As shown in FIG. 2, the filling layer 700 has a top surface 710, and the reflective layer 900 covers the top surface 710 of the filling layer directly or indirectly. In addition, in this embodiment, the filling layer 700 is distributed between the micro LED 300 and the reflective layer 900. As shown in FIG. 2, the reflective layer 900 may extend to a top end of the sidewall structure 500, but the present invention is not limited thereto. The reflective layer 900 is reflective, preferably has higher reflectivity than the filling layer 700, and is capable of reflecting at least a part of light reaching the reflective layer 900. A material of the reflective layer 900 may be metal, plastic, printing ink, or the like; a disposition method includes, but is not limited to, coating, plating, spraying, and the like. In addition, as shown in FIG. 2, the reflective layer 900 has a plurality of light-transmissible windows 910. The light-transmissible windows 910 are preferably hollowed-out through holes, which may be formed through etching or in other manners. In different embodiments, the light-transmissible windows 910 may also be formed by a light-transmissible material, that is, the light-transmissible windows 910 have higher light transmittance than other parts of the reflective layer 900.

Figure 3:
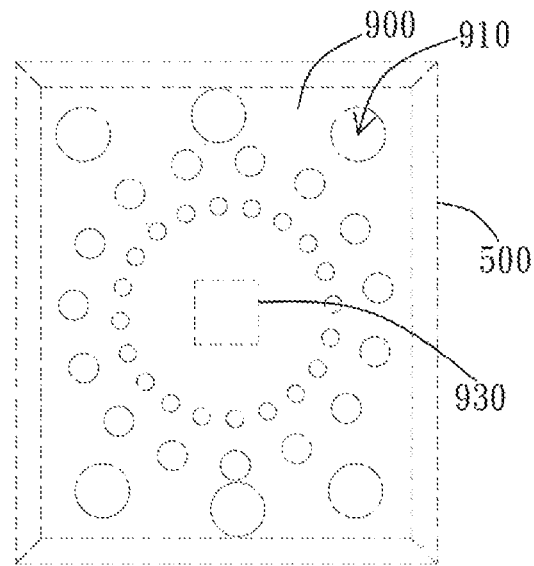
FIG. 3 is a top view of the embodiment in FIG. 2.

As shown in FIG. 2 and FIG. 3, the micro LED 300 forms, in a vertical projection direction, a vertical projection region 930 in an overlapping region on the reflective layer 900. Among the light-transmissible windows 910, those have longer distances to the vertical projection region 930 have larger areas. In this embodiment, the micro LED 300 is disposed to at the center of the part of the accommodation cavity 510 covered by the reflective layer 900. Therefore, the light-transmissible windows 910 closer to the center have smaller areas. In addition, in this embodiment, all the light-transmissible windows 910 are disposed outside the vertical projection region 930. Therefore, no light-transmissible window 910 is distributed right above the micro LED 300. However, in a different embodiment, some light-transmissible windows 910 may still partially overlap with the vertical projection region 930.

With such a configuration, light generated by the micro LED 300 reaches the reflective layer 900 through the filling layer 700, where a part of the light passes through the light-transmissible window 910, and a part of the light is reflected by the reflective layer 900 back to the accommodation cavity 510, is transferred to other positions of the reflective layer 900, and then goes out. Preferably, outgoing light right above the micro LED 300 generally has higher intensity. Because the light-transmissible window 910 above the micro LED 300 has a lower aperture ratio, wave crest light intensity of a single pixel structure above the micro LED 300 can be reduced, and the width of a peak region with higher light intensity can be increased, so as to achieve a uniform effect. In this way, because a difference in wave crest intensity of light generated by each pixel structure can also be reduced accordingly, the overall luminance of the display device can be more uniform.

Figure 4A:
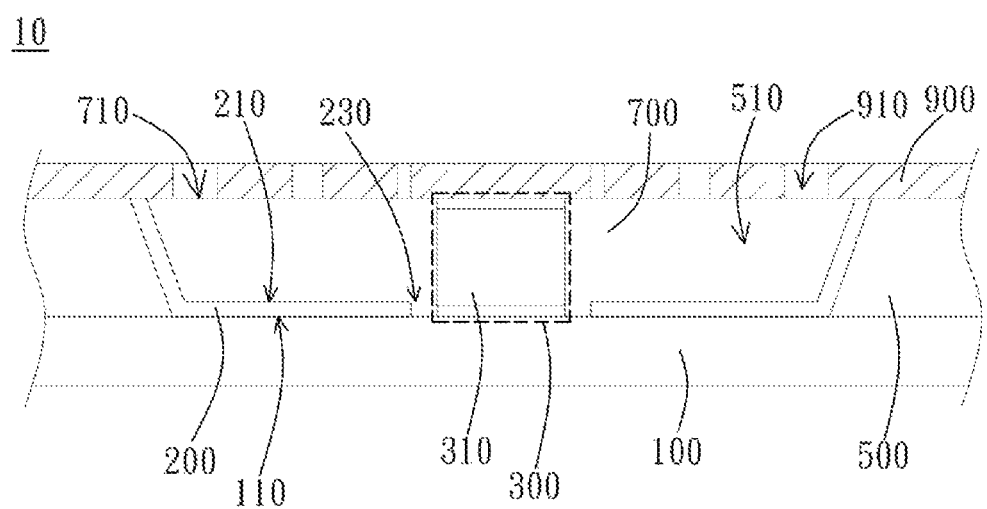
FIG. 4A is a schematic cross-sectional view of another embodiment of a pixel structure.

FIG. 4A shows another embodiment of a pixel structure 10. In this embodiment, as shown in FIG. 4A, the micro LED 300 may use a vertical structure design, and an electrode is disposed at a top portion of the micro LED 300.

Figure 4B:
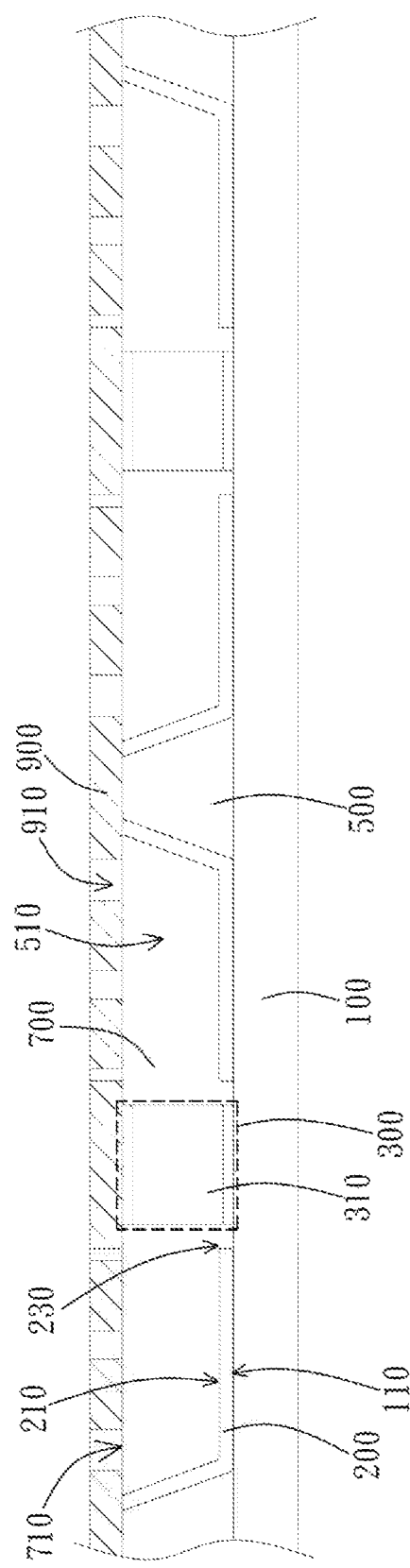
FIG. 4B is a variant embodiment of the pixel structure shown in FIG. 4A.

Moreover, the reflective layer 900 may be electrically connected to and transmit a signal to the electrode at the top portion of the micro LED 300. Therefore, as shown in FIG. 4A, unlike the foregoing embodiment, the filling layer 700 is not disposed between the micro LED 300 and the reflective layer 900. Besides, in the embodiment shown in FIG. 4B, reflective layers 900 of adjacent pixel structures may also be electrically connected, so as to supply power to the micro LED 300 in each pixel structure.

Figure 5A:
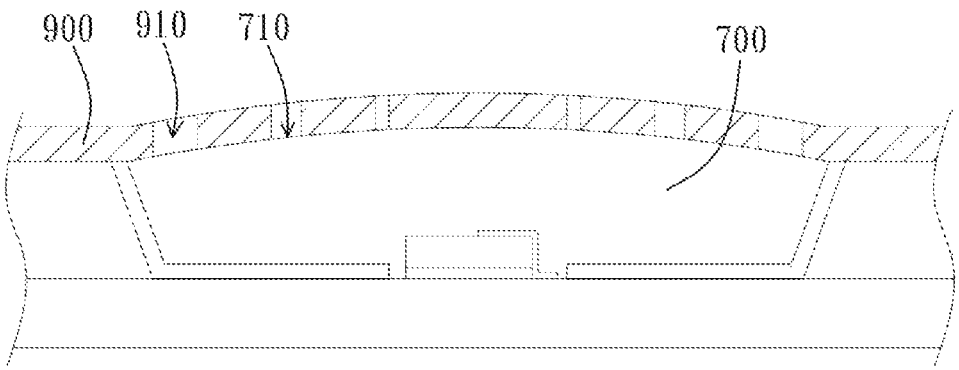
FIG. 5A is a schematic cross-sectional view of an embodiment of a pixel structure with an outward protruding surface.
Figure 5B:
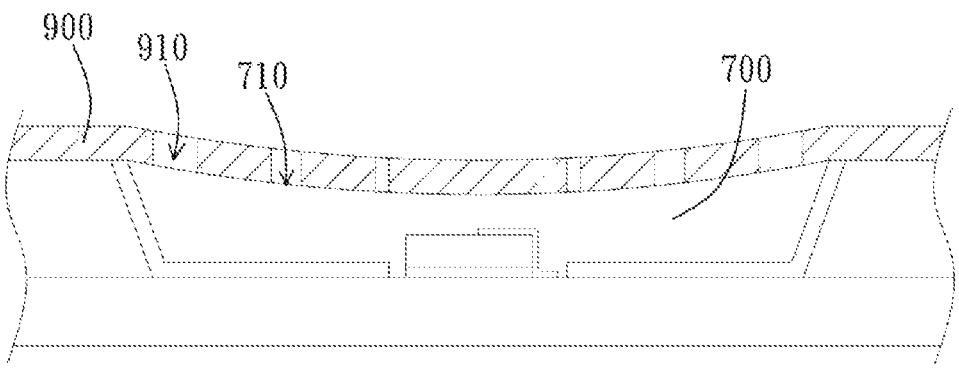
FIG. 5B is a schematic cross-sectional view of an embodiment of a pixel structure with an inwardly-concave surface.

In the foregoing embodiment, the top surface 710 of the filling layer is formed as a plane. However, in a different embodiment, as shown in FIG. 5A, the top surface 710 of the filling layer may also be formed as an outward-protruding surface, so that light going out from the pixel structure is centralized, thereby enhancing the luminance in a front view direction. In addition, in a variant embodiment shown in FIG. 5B, the top surface 710 of the filling layer may also be formed as an inwardly-concave surface, so that light going out from the pixel structure is diffused, thereby enhancing the luminance in a direction of a wide visual angle.

Figure 6:
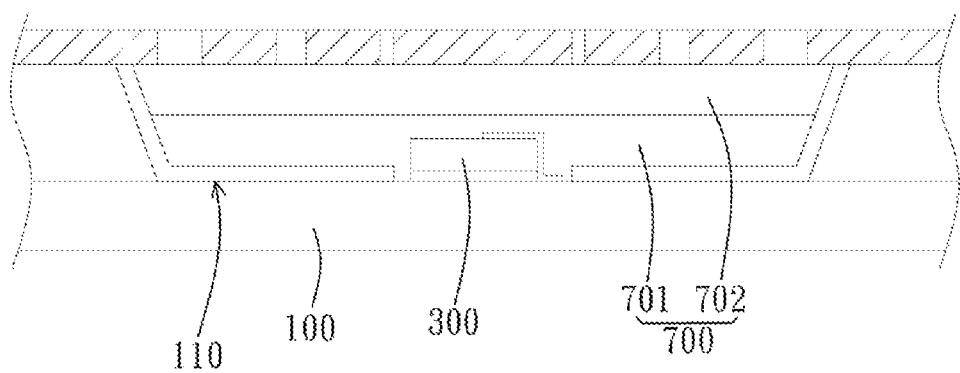
FIG. 6 is a variant embodiment of a filling layer.

FIG. 6 shows another embodiment of a pixel structure 10. In this embodiment, the filling layer 700 comprises a plurality of light-transmissible layers laminated on each other, for example, a first light-transmissible layer 701 and a second light-transmissible layer 702. The first light-transmissible layer 701 is disposed on the bearing surface 110, and the second light-transmissible layer 702 is laminated on the first light-transmissible layer 701. Compared with the second light-transmissible layer 702, the first light-transmissible layer 701 is closer to the micro LED 300. To achieve a better optical performance, the first light-transmissible layer 701 has a higher refractive index than the second light-transmissible layer 702. Preferably, when the filling layer 700 comprises a larger number of light-transmissible layers laminated on each other, light-transmissible layers closer to the micro LED 300 can have higher refractive indexes.

Figure 7A:
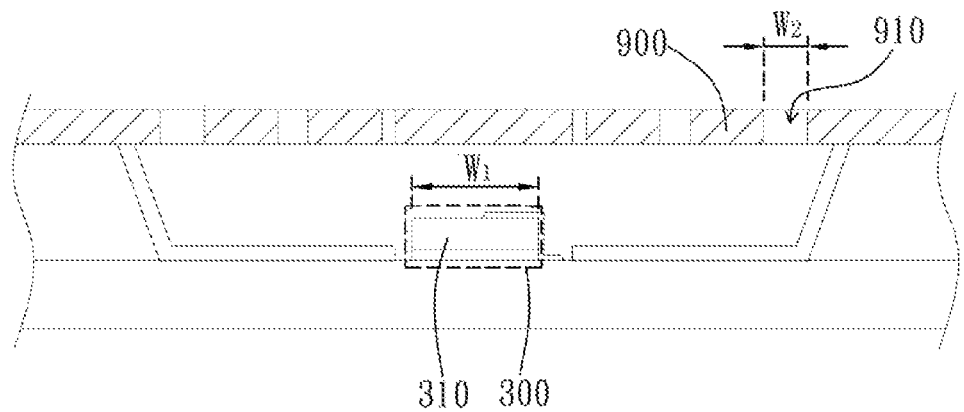
FIG. 7A and FIG. 7B are cross-sectional views of variant embodiments illustrating sizes of a light transmitting hole.

As shown in FIG. 7A, the micro LED 300 has a first width $W_1$. Preferably, the first width $W_1$ refers to a width of the active light emitting layer 310, which is included in the micro LED 300, on a preset cross section (such as the cross section shown in FIG. 7A). The light-transmissible windows 910 respectively have a second width $W_2$. Preferably, the second width $W_2$ refers to a width of the light-transmissible window 910 on the same preset cross section described above (such as the cross section shown in FIG. 7A). For example, when the light-transmissible windows 910 are circular, but is not limited thereto, the second width $W_2$ is a diameter of each light-transmissible window 910. Preferably, each second width $W_2$ is equal to or less than the first width $W_1$.

Figure 7B:
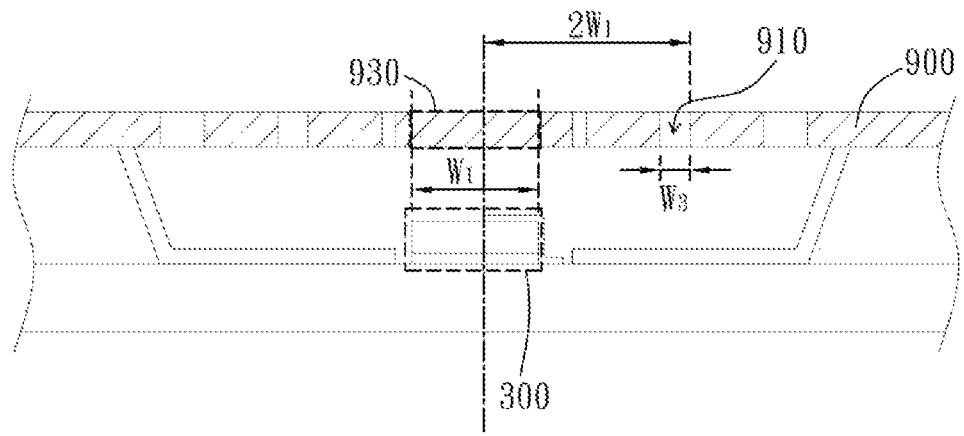

FIG. 7B shows a variant embodiment of the embodiment shown in FIG. 7A. In this embodiment, the micro LED 300 also as the first width $W_1$ described above. As shown in FIG. 7B, some of the light-transmissible windows 910 are distributed within a range of twice the first width $W_1$ from the center of the vertical projection region 930, and these light-transmissible windows 910 respectively have a third width $W_3$. Preferably, the third width $W_3$ is a width of each of the light-transmissible windows 910 on the same cross section as described above. However, when the light-transmissible windows 910 are circular, the third width $W_3$ is a diameter of each light-transmissible window 910. In this embodiment, the third width $W_3$ is between 1 μm and 20 μm.

Based on the general size and light distribution trend of the micro LED 300, light distribution is uniform and production is possible when configuration is performed in the foregoing manner. However, the present invention is not limited thereto.

Figure 8:
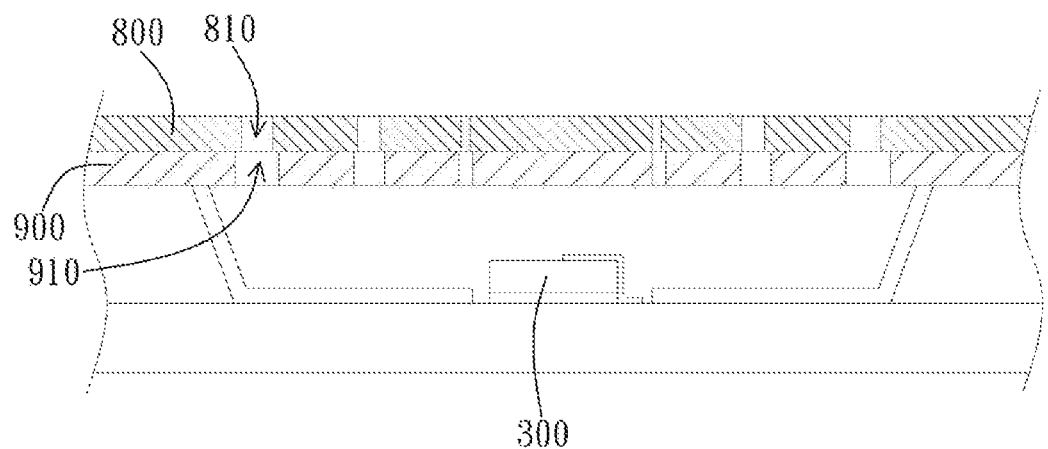
FIG. 8 is a schematic cross-sectional view of another embodiment of a pixel structure.

FIG. 8 shows another embodiment of a pixel structure. In this embodiment, a low-reflective layer 800 is additionally disposed on the reflective layer 900, that is, disposed on a side of the reflective layer 900 which is opposite to the micro LED 300. Reflectivity of the low-reflective layer 800 is lower than that of the reflective layer 900, so as to reflect less ambient light, thereby improving display effects such as contrast. As shown in FIG. 8, the low-reflective layer 800 has a plurality of openings 810. The openings 810 correspond to the positions of the light-transmissible windows 910 respectively. The openings 810 are preferably formed as through holes, or may be formed by a light-transmissible material. In this embodiment, areas of the openings 810 are smaller than areas of the corresponding light-transmissible windows 910, so as to further improve an anti-reflection effect for the ambient light; however, the present invention is not limited thereto.

Figure 9A:
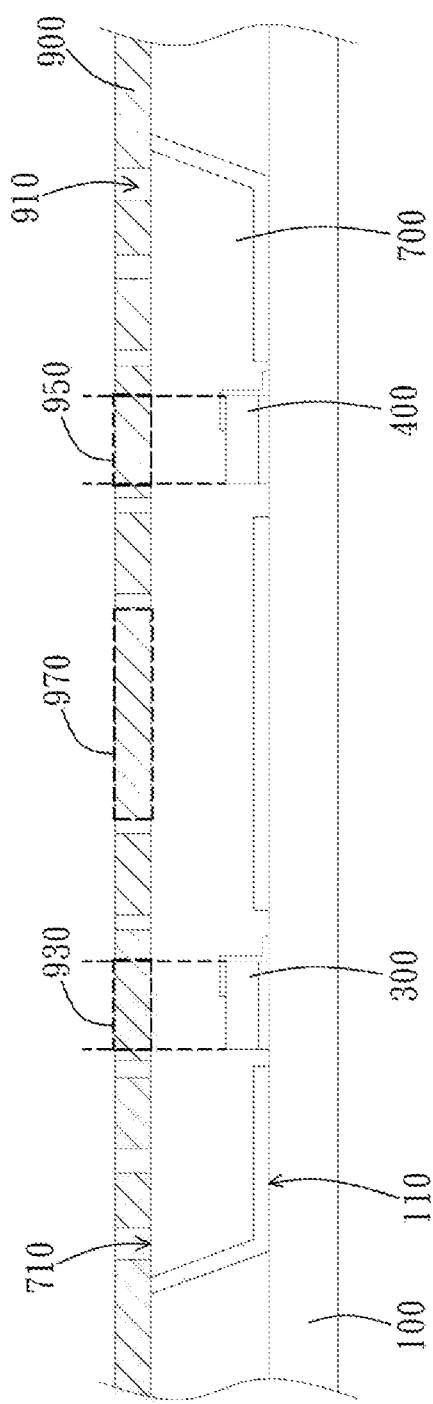
FIG. 9A is a schematic cross-sectional view of another embodiment of a pixel structure.
Figure 9B:
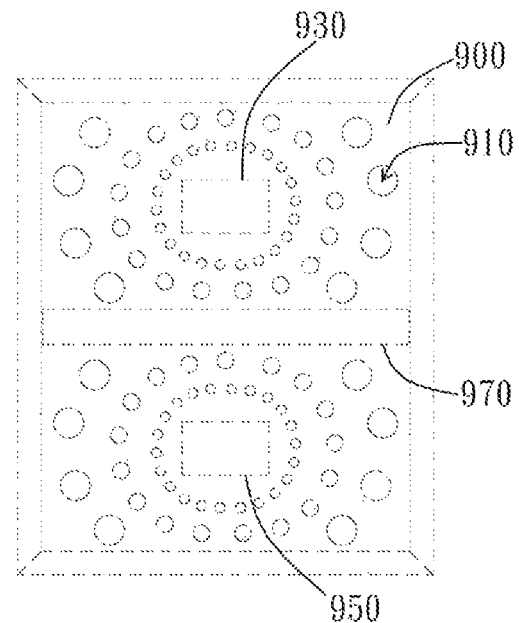
FIG. 9B is a schematic top view of the embodiment shown in FIG. 9A.

FIG. 9A and FIG. 9B show another embodiment of a pixel structure. In this embodiment, the pixel structure further includes a second micro LED 400 disposed in the accommodation cavity 510, and there is a preset spacing between the second micro LED 400 and the micro LED 300. Preferably, the accommodation cavity 510 may be rectangular; the micro LED 300 and the second micro LED 400 are distributed along a direction of a long side of the accommodation cavity 510. Similar to the micro LED 300, the second micro LED 400 preferably refers to a micron-scale LED, for example, the size is from one micron to dozens of microns. For example, the size is equal to or less than 30 μm, but is not limited thereto. As shown in FIG. 9B, the second micro LED 400 forms, in a vertical projection direction, a second vertical projection region 950 in an overlapping region on the reflective layer 900. For the light-transmissible windows 910 disposed on the second micro LED 400, those have longer distances to the second vertical projection region 950 have larger areas.

As shown in FIG. 9B, the reflective layer 900 has an intermediate zone 970 between the vertical projection region 930 and the second vertical projection region 950. Preferably, the intermediate zone 970 refers to a broad band region on the reflective layer 900, and is transversely disposed between the vertical projection region 930 and the second vertical projection region 950. Preferably, the intermediate zone 970 is merely formed by an original base material of the reflective layer 900. In this embodiment, no light-transmissible window 910 is disposed in the intermediate zone 970, so as to optimize light generated by the micro LED 300 and the second micro LED 400.

Figure 9C:
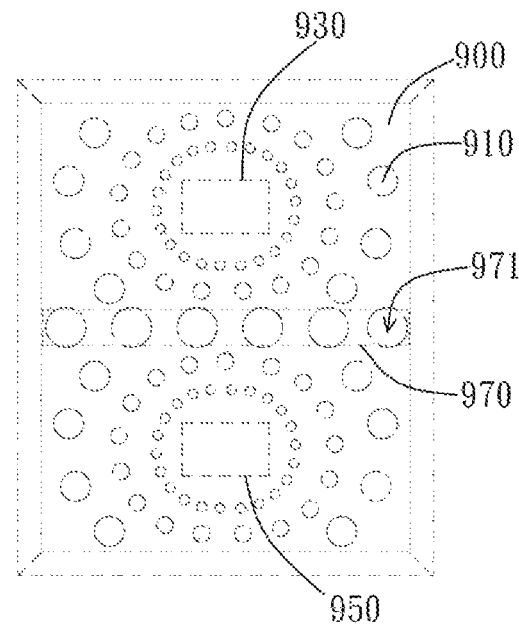
FIG. 9C is a variant embodiment of the embodiment shown in FIG. 9B.

However, in a different embodiment, as shown in FIG. 9C, a plurality of intermediate light-transmissible windows 971 may also be disposed in the intermediate zone 970, and an area of any one of the intermediate light-transmissible windows 971 is larger than an area of any one of the light-transmissible windows 910. With such a design, light generated by the micro LED 300 and the second micro LED 400 can be mixed desirably. When the same pixel structure has both the micro LED 300 and the second micro LED 400, it is possible to use such a design that both the LEDs emit light or only one LED emits light while the other LED is on standby. Therefore, the foregoing different disposition manners of the reflective layer 900 may be selected for coordination.

Figure 10:
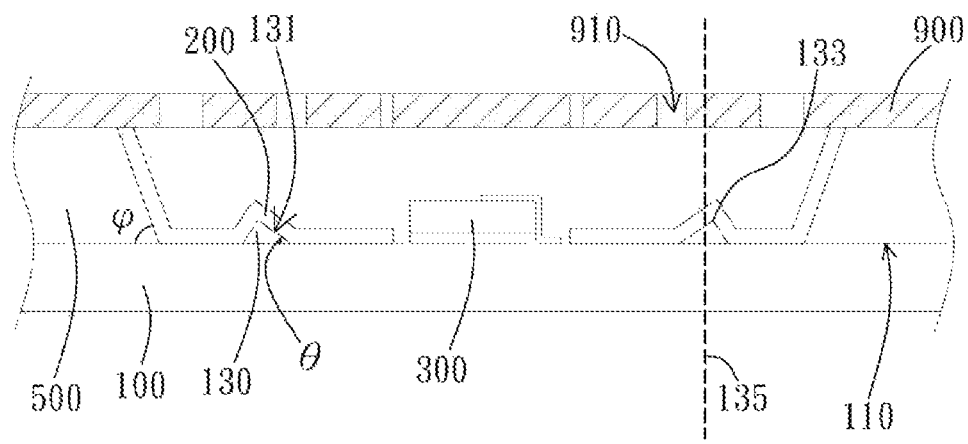
FIG. 10 is a schematic cross-sectional view of another embodiment of a pixel structure.

In the embodiment shown in FIG. 10, the bearing surface 110 has at least one protrusion structure 130. The protrusion structure 130 is disposed at the bottom of each accommodation cavity 510 within the sidewall structure 500 and surrounds the micro LED 300. Preferably, a bottom reflective layer 200 may be disposed to cover the protrusion structure 130. However, in a different embodiment, the protrusion structure 130 may also be reflective itself, and therefore, no bottom reflective layer 200 is disposed. As shown in FIG. 10, the protrusion structure 130 has a tilted surface 131. The tilted surface 131 is tilted towards the micro LED 300, that is, close to the micro LED 300 and at the same time tilted downwards. The disposition of the tilted surface 131 can improve the efficiency of reflecting light, which is reflected by the reflective layer 900, to the reflective layer 900. As shown in FIG. 10, a top end of the tilted surface 131 is formed as a top portion 133 of the protrusion structure 130. For the cross section shown in FIG. 10, in a direction of vertical projection on the substrate 100, for example, from the perspective of the range of vertical projection on the substrate 100, the position of the top portion 133 is closer to the sidewall structure 500 than the position of an centroid 135 of the protrusion structure 130, so that the area of the tilted surface 131 can be increased. Through the configuration of the light-transmissible windows 910 of the reflective layer 900 in coordination with the protrusion structure 130, the reflection efficiency can be improved; moreover, light emitted by the LED 300 is reflected multiple times, and the protrusion structure 130 also reflects light, so that the light distribution is more uniform.

In this embodiment, as shown in FIG. 10, an angle $\theta$ is formed between the tilted surface 131 and the bearing surface 110, an angle $\varphi$ is formed between an inner surface of the sidewall structure 500 and the bearing surface 110, and the angle $\theta$ is preferably smaller than the angle $\varphi$, so as to improve the reflection efficiency.

Figure 11:
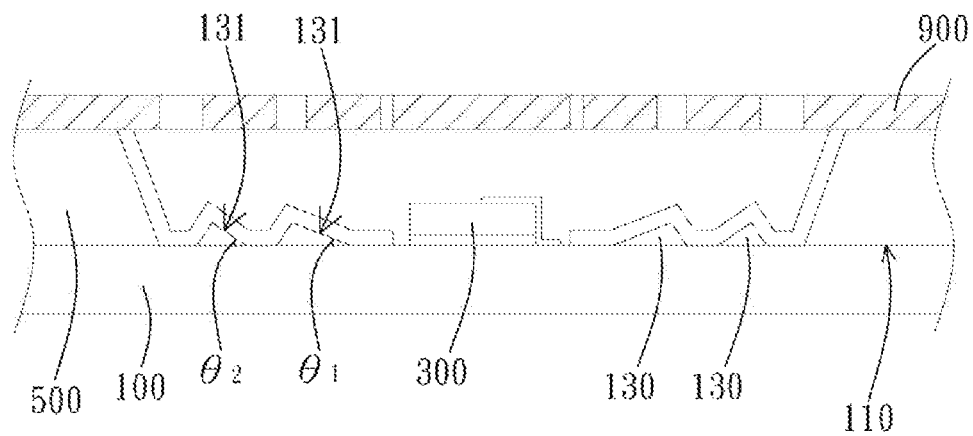
FIG. 11 is a variant embodiment of the embodiment shown in FIG. 10.

In addition, as shown in FIG. 11, when there are multiple protrusion structures 130 on the same cross section, for a protrusion structure closer to the micro LED 300, the tilted surface 131 thereof forms a first angle $\theta_1$ with the bearing surface 110; for a protrusion structure closer to the sidewall structure 500, the tilted surface 131 thereof forms a second angle $\theta_2$ with the bearing surface 110. Preferably, the second angle $\theta_2$ is larger than the first angle $\theta_1$. Because reflected light received at a position closer to the sidewall structure 500 may have a larger angle, through the foregoing configuration, reflected light with a larger angle can be guided to go out at a specified direction. In addition, in a different embodiment, the bottom reflective layer 200 may not be disposed on the tilted surface 131 closer to the micro LED 300, so as to reduce primary reflection of light emitted from the micro LED 300.

Figure 12:
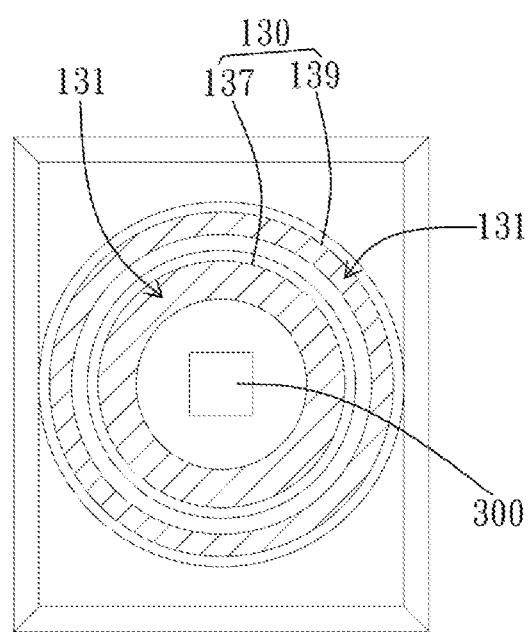
FIG. 12 is a schematic top view of the embodiment shown in FIG. 11.

The protrusion structures 130 may be multiple protruding blocks; in addition, as shown in the top view in FIG. 12, the protrusion structures 130 may also be disposed annularly on the bearing surface 110, and at least one protrusion structure includes an inner-ring protrusion structure 137 and an outer-ring protrusion structure 139. The outer-ring protrusion structure 139 is disposed on an outer side of the inner-ring protrusion structure 137, and an angle of the outer-ring protrusion structure 139 with the tilted surface 131 is larger than an angle of the inner-ring protrusion structure 137 with the tilted surface 131. However, in a different embodiment, the protrusion structures 130 may also be disposed as dots surrounding the micro LED 300, and are not limited to the annular disposition.

Figure 13:
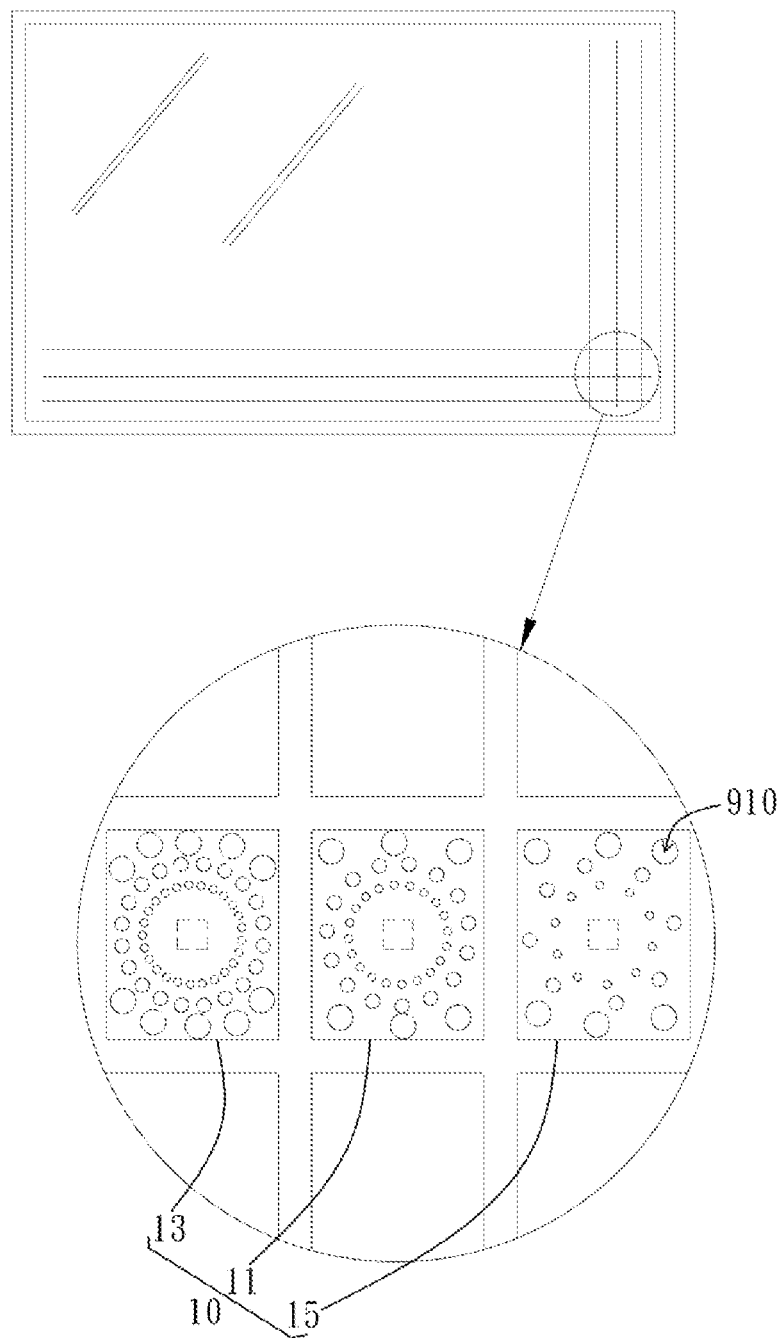
FIG. 13 is a schematic view of an embodiment of a display panel.

FIG. 13 is a schematic view of an embodiment of a display panel. As shown in FIG. 13, the display panel includes a plurality of pixel structures 10. The pixel structures 10 include a red pixel structure 11, a green pixel structure 13, and a blue pixel structure 15. Each pixel structure 10 has a total area of the light-transmissible windows, that is, a sum of areas of all light-transmissible windows 910 in a single pixel structure 10. Preferably, the red pixel structure 11, the green pixel structure 13, and the blue pixel structure 15 respectively have different total areas of the light-transmissible windows. For example, the total area of the light-transmissible windows of the red pixel structure 11 is preferably larger than the total area of the light-transmissible windows of the blue pixel structure 15. For another example, the total area of the light-transmissible windows of the green pixel structure 13 is preferably larger than the total area of the light-transmissible windows of the red pixel structure 11. With such a configuration, color tones presented by the display panel and uniformity of light in different colors can be adjusted, thereby obtaining better image display quality.

In addition, for pixel structures 10 with the same color, a pixel structure disposed in an edge region of the display panel and a pixel structure disposed in a central region of the display panel may also respectively have different total areas of the light-transmissible windows. With such a configuration, the overall optical taste of the display panel can be adjusted, so as to obtain better display quality.

The present invention has been described through the foregoing related embodiments. However, the foregoing embodiments are merely examples of the present invention. It should be noted that, the disclosed embodiments do not limit the scope of the present invention. On the contrary, all modifications and equivalent configurations within the spirit and scope of the claims fall within the scope of the present invention.

What is claimed is:

1. A display panel, comprising a plurality of pixel structures arranged side by side; wherein each pixel structure of the plurality of pixel structures comprises:
   a substrate having a bearing surface;
   a micro LED disposed on the bearing surface;
   a sidewall structure disposed on the bearing surface to define an accommodation cavity individually corresponding to the pixel structure, wherein the micro LED is located in the accommodation cavity;
   a filling layer filled in the accommodation cavity and surrounding the micro LED to connect the micro LED and the sidewall structure, the filling layer having a top surface; and
   a reflective layer attaching the top surface of the filling layer and having a plurality of light-transmissible windows,
   wherein the micro LED has a vertical projection region on the reflective layer, and among the light-transmissible windows, those having longer distances to the vertical projection region have larger areas,
   wherein the bearing surface has at least one protrusion structure surrounding the micro LED and located in the accommodation cavity between the sidewall structure and the micro LED, and each protrusion structure has a tilted surface facing the micro LED,
   wherein an interior angle of the protrusion structure between the tilted surface and a portion of the bearing surface is smaller than an included angle between an inner surface of the sidewall structure and the bearing surface.

2. The display panel according to claim 1, wherein the light-transmissible windows are disposed outside the vertical projection region.

3. The display panel according to claim 1, wherein the reflective layer extends to a top end of the sidewall structure.

4. The display panel according to claim 1, further comprising a plurality of protrusion structures and a bottom reflective layer, wherein the protrusion structures are disposed on the bearing surface, and the bottom reflective layer covers the protrusion structures and surrounds the micro LED.

5. The display panel according to claim 4, wherein each of the protrusion structures has a top portion, and in a direction of vertical projection on the substrate, positions of the top portions are closer to the sidewall structure than positions of centroids of the protrusion structures.

6. The display panel according to claim 1, wherein the filling layer comprises a plurality of light-transmissible layers laminated on each other, and among the light-transmissible layers, those closer to the micro LED have higher refractive indexes.

7. The display panel according to claim 1, wherein the micro LED has a first width, the light-transmissible windows respectively have a second width, and the second width is equal to or less than the first width.

8. The display panel pixel structure according to claim 1, wherein the micro LED has a first width, among the light-transmissible windows, those distributed within twice the first width from a center of the vertical projection region respectively have a third width, and the third width is between 1 μm to 20 μm.

9. The display panel pixel structure according to claim 1, wherein the top surface of the filling layer is an outward-protruding surface, and the reflective layer is disposed on the outward-protruding surface.

10. The display panel according to claim 1, wherein the top surface of the filling layer is an inwardly-concave surface, and the reflective layer is disposed on the inwardly-concave surface.

11. The display panel according to claim 1, further comprising a low-reflective layer disposed on the reflective layer, wherein the low-reflective layer has a plurality of openings corresponding to the light-transmissible windows, respectively.

12. The display panel according to claim 11, wherein areas of the openings of the low-reflective layer are smaller than areas of the corresponding light-transmissible windows, respectively.

13. The display panel according to claim 1, further comprising a second micro LED disposed in the accommodation cavity, a spacing existing between the second micro LED and the micro LED, wherein the second micro LED has a second vertical projection region on the reflective layer, and among the light-transmissible windows, those having longer distances to the second vertical projection region have larger areas.

14. The display panel according to claim 13, wherein the reflective layer has an intermediate zone located between the vertical projection region and the second vertical projection region, and the light-transmissible windows are disposed outside the intermediate zone.

15. The display panel according to claim 13, wherein the reflective layer has an intermediate zone located between the vertical projection region and the second vertical projection region, the intermediate zone has a plurality of intermediate light-transmissible windows, and any one of the intermediate light-transmissible windows has a larger area than any one of the light-transmissible windows.

16. The display panel according to claim 1, wherein the at least one protrusion structure comprises an inner-ring protrusion structure and an outer-ring protrusion structure surrounding an outer side of the inner-ring protrusion structure, the tilted surface of the inner-ring protrusion structure forms a first interior angle with the bearing surface, the tilted surface of the outer-ring protrusion structure forms a second interior angle with the bearing surface, and the second interior angle is larger than the first interior angle.

17. The display panel according to claim 1,
wherein the plurality of pixel structures comprise a red pixel structure, a green pixel structure, and a blue pixel structure that respectively have different total areas of the light-transmissible windows.

18. The display panel according to claim 1, wherein the pixel structures disposed in an edge region of the display panel and the pixel structures disposed in a middle region of the display panel respectively have different total areas of the light-transmissible windows.

19. The display panel according to claim 17, wherein the total area of the light-transmissible windows of the green pixel structure is larger than the total area of the light-transmissible windows of the red pixel structure.

20. The display panel according to claim 17, wherein the total area of the light-transmissible windows of the red pixel structure is larger than the total area of the light-transmissible windows of the blue pixel structure.

\* \* \* \* \*